(12) United States Patent
Park

(10) Patent No.: US 12,000,553 B2
(45) Date of Patent: *Jun. 4, 2024

(54) LIGHTING DEVICE AND VEHICLE LAMP COMPRISING SAME

(71) Applicant: LG INNOTEK CO., LTD., Seoul (KR)

(72) Inventor: Hoon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/731,921

(22) Filed: Apr. 28, 2022

(65) Prior Publication Data

US 2022/0260221 A1 Aug. 18, 2022

Related U.S. Application Data

(63) Continuation of application No. 17/421,473, filed as application No. PCT/KR2020/001155 on Jan. 23, 2020, now Pat. No. 11,415,284.

(30) Foreign Application Priority Data

Jan. 24, 2019 (KR) .......................... 10-2019-0009282

(51) Int. Cl.
  *F21S 41/176* (2018.01)
  *F21K 9/61* (2016.01)
  (Continued)

(52) U.S. Cl.
  CPC ........... *F21S 41/176* (2018.01); *F21S 41/148* (2018.01); *F21S 41/20* (2018.01); *F21K 9/61* (2016.08);
  (Continued)

(58) Field of Classification Search
  CPC ...... F21S 41/143; F21S 41/147; F21S 41/148; F21S 41/151; F21S 41/153; F21S 41/176;
  (Continued)

(56) References Cited

U.S. PATENT DOCUMENTS 8,907,357 B2 12/2014 Kojima et al.
9,194,566 B2 11/2015 Oh
(Continued)

FOREIGN PATENT DOCUMENTS

CN 103486511 1/2014
CN 103867987 6/2014
(Continued)

OTHER PUBLICATIONS

International Search Report dated May 11, 2020 issued in Application No. PCT/KR2020/001155.
(Continued)

*Primary Examiner* — Colin J Cattanach
(74) *Attorney, Agent, or Firm* — KED & ASSOCIATES, LLP

(57) ABSTRACT

A lighting device disclosed in the embodiment of the invention includes a base member including a straight portion and a curved portion, a substrate including a first substrate disposed on the straight portion of the base member and a second substrate disposed on the curved portion; a plurality of light sources disposed on each of the first and second substrates, a resin layer including a first resin portion disposed on the first substrate and a second resin portion surrounding the second substrate, and a phosphor layer disposed on the resin layer, and an outer side surface of the second resin portion may include a curved surface.

20 Claims, 6 Drawing Sheets

(51) Int. Cl.

| | |
|---|---|
| *F21K 9/64* | (2016.01) |
| *F21K 9/69* | (2016.01) |
| *F21S 41/143* | (2018.01) |
| *F21S 41/145* | (2018.01) |
| *F21S 41/147* | (2018.01) |
| *F21S 41/148* | (2018.01) |
| *F21S 41/153* | (2018.01) |
| *F21S 41/20* | (2018.01) |
| *F21S 41/29* | (2018.01) |
| *F21S 41/365* | (2018.01) |
| *F21S 43/16* | (2018.01) |
| *F21V 9/30* | (2018.01) |
| *F21V 9/32* | (2018.01) |
| *F21V 9/35* | (2018.01) |
| *F21Y 107/90* | (2016.01) |
| *F21Y 109/00* | (2016.01) |
| *H01L 33/50* | (2010.01) |
| *H01L 33/60* | (2010.01) |
| *F21S 41/151* | (2018.01) |
| *F21S 41/24* | (2018.01) |
| *F21S 41/255* | (2018.01) |
| *F21S 41/26* | (2018.01) |
| *F21S 41/265* | (2018.01) |
| *F21S 41/27* | (2018.01) |
| *F21S 41/275* | (2018.01) |
| *H01L 33/52* | (2010.01) |
| *H01L 33/54* | (2010.01) |
| *H01L 33/58* | (2010.01) |

(52) U.S. Cl.
CPC ............... *F21K 9/64* (2016.08); *F21K 9/69* (2016.08); *F21S 41/143* (2018.01); *F21S 41/145* (2018.01); *F21S 41/147* (2018.01); *F21S 41/151* (2018.01); *F21S 41/153* (2018.01); *F21S 41/24* (2018.01); *F21S 41/255* (2018.01); *F21S 41/26* (2018.01); *F21S 41/265* (2018.01); *F21S 41/27* (2018.01); *F21S 41/275* (2018.01); *F21S 41/28* (2018.01); *F21S 41/285* (2018.01); *F21S 41/29* (2018.01); *F21S 41/365* (2018.01); *F21S 43/16* (2018.01); *F21V 9/30* (2018.02); *F21V 9/32* (2018.02); *F21V 9/35* (2018.02); *F21Y 2107/90* (2016.08); *F21Y 2109/00* (2016.08); *H01L 33/50* (2013.01); *H01L 33/505* (2013.01); *H01L 33/507* (2013.01); *H01L 33/508* (2013.01); *H01L 33/52* (2013.01); *H01L 33/54* (2013.01); *H01L 33/58* (2013.01); *H01L 33/60* (2013.01)

(58) Field of Classification Search
CPC .......... F21S 41/24; F21S 41/255; F21S 41/26; F21S 41/265; F21S 41/27; F21S 41/275; F21S 41/28; F21S 41/285; F21S 41/29; F21S 43/16; F21K 9/232; F21K 9/64; F21K 9/61; F21K 9/69; F21V 5/10; F21V 7/30; F21V 7/0091; F21V 9/30; F21V 9/32; F21V 9/38; F21V 13/14; H01L 2933/0058; H01L 2933/0041; H01L 33/52; H01L 33/54; H01L 33/56; H01L 33/58; H01L 33/507; H01L 27/153; H01L 27/156; H01L 33/50; H01L 33/505; H01L 33/508; H01L 33/60; F21Y 2105/00; F21Y 2105/10; F21Y 2105/12; F21Y 2105/14; F21Y 2105/16; F21Y 2105/18; B60Q 2400/10
See application file for complete search history.

(56) References Cited

U.S. PATENT DOCUMENTS

| | | |
|---|---|---|
| 9,333,905 B2 | 5/2016 | Nomura et al. |
| 9,420,642 B2 | 8/2016 | Abe et al. |
| 9,671,069 B2 | 6/2017 | Lee et al. |
| 9,890,916 B2 | 2/2018 | Oh |
| 9,970,627 B2 | 5/2018 | Lee et al. |
| 10,018,322 B2 | 7/2018 | Ito et al. |
| 10,132,459 B2 | 11/2018 | Daicho et al. |
| 11,415,284 B2 * | 8/2022 | Park ................ F21S 41/148 |
| 2011/0156067 A1 | 6/2011 | Lin |
| 2013/0182432 A1 | 7/2013 | Yoo |
| 2013/0215634 A1 | 8/2013 | Tseng |
| 2013/0285077 A1 | 10/2013 | Kojima et al. |
| 2013/0329445 A1 | 12/2013 | Oh |
| 2014/0063805 A1 | 3/2014 | Song et al. |
| 2014/0168997 A1 | 6/2014 | Lee et al. |
| 2014/0211449 A1 | 7/2014 | Nomura et al. |
| 2014/0306599 A1 | 10/2014 | Edwards |
| 2014/0347854 A1 | 11/2014 | Lee et al. |
| 2015/0054004 A1 | 2/2015 | Kojima et al. |
| 2015/0131278 A1 | 5/2015 | Chen |
| 2015/0138802 A1 | 5/2015 | Salter |
| 2015/0138807 A1 | 5/2015 | Salter |
| 2015/0197180 A1 | 7/2015 | Salter |
| 2015/0345740 A1 | 12/2015 | Watanabe |
| 2016/0061397 A1 | 3/2016 | Ito et al. |
| 2016/0081142 A1 | 3/2016 | Abe et al. |
| 2016/0233199 A1 | 8/2016 | Cho et al. |
| 2017/0113605 A1 | 4/2017 | Daicho et al. |
| 2018/0009382 A1 | 1/2018 | Mi et al. |
| 2018/0163942 A1 * | 6/2018 | Salter ................ F21S 43/14 |
| 2018/0209604 A1 | 7/2018 | Kim |
| 2018/0328545 A1 | 11/2018 | Jiang |
| 2019/0376669 A1 | 12/2019 | Shao |

FOREIGN PATENT DOCUMENTS

| | | |
|---|---|---|
| JP | 2012-49333 | 3/2012 |
| JP | 2013-232477 | 11/2013 |
| JP | 2014-146750 | 8/2014 |
| JP | 2014-235817 | 12/2014 |
| JP | 2015-53233 | 3/2015 |
| JP | 2015-215995 | 12/2015 |
| JP | 2016-51571 | 4/2016 |
| JP | 2016-058614 | 4/2016 |
| JP | 3207416 | 11/2016 |
| JP | 2018-73714 | 5/2018 |
| JP | 2018-195381 | 12/2018 |
| KR | 10-2005-0049795 | 5/2005 |
| KR | 10-0801923 | 2/2008 |
| KR | 20-2011-0002497 | 3/2011 |
| KR | 10-2013-0138111 | 12/2013 |
| WO | WO 2011/078217 | 6/2011 |
| WO | WO 2014/033996 | 3/2014 |
| WO | WO 2016/006698 | 1/2016 |

OTHER PUBLICATIONS

U.S. Notice of Allowance dated Jan. 31, 2022 issued in parent U.S. Appl. No. 17/421,473.
Chinese Office Action dated Jan. 18, 2023 issued in Application No. 202080010747.9.
Extended European Search Report dated Sep. 5, 2022 issued in Application No. 20744547.9.
Japanese Office Action dated Oct. 10, 2023 issued in Application No. 2021-542212.

* cited by examiner

LIGHTING DEVICE AND VEHICLE LAMP COMPRISING SAME

CROSS-REFERENCE TO RELATED APPLICATIONS

This application is a Continuation application of U.S. patent application Ser. No. 17/421,473 filed Jul. 8, 2021, which is a U.S. National Stage Application under 35 U.S.C. § 371 of PCT Application No. PCT/KR2020/001155, filed Jan. 23, 2020, which claims priority to Korean Patent Application No. 10-2019-0009282, filed Jan. 24, 2019, whose entire disclosures are hereby incorporated by reference.

BACKGROUND

1. Field

An embodiment of the invention relates to a lighting device of a surface light emission for improving light efficiency.

2. Background

In general, a light emitting device, for example, a light emitting diode (LED), has advantages such as low power consumption, semi-permanent life, fast response speed, safety, and environmental friendliness compared to conventional light sources such as fluorescent lamps and incandescent lamps. Such light emitting diodes are being applied to various lighting devices such as various display devices, indoor lights or outdoor lights. Recently, as a light source for a vehicle, a lamp employing a light emitting device has been proposed. Compared with an incandescent lamp, the light emitting device is advantageous in that power consumption is small. Since the light emitting device is small in size, it can increase the design freedom of the lamp and it is economical due to its semi-permanent life. Such a vehicle lighting device uses a surface light source lighting device, thereby creating a three-dimensional effect and a unique aesthetic feeling of the vehicle lamp. In the conventional rear lamp for a vehicle, the light source module is formed in a structure corresponding to the lamp bracket according to the lamp bracket structure of the curved structure. In order to form the light source module to have a curvature, a PCB substrate as thin as possible is used, and thus, there is a problem in that a durability of the module is weak. In addition, stress is applied to the PCB substrate and the light source in the process of giving the PCB substrate a curvature, so that the structure has a weaker durability. In addition, as the light source module is formed to have a curvature, the light distribution at the rear direction of the vehicle is reduced, and an additional light source is further attached to comply with the light distribution law, thereby increasing the cost.

BRIEF DESCRIPTION OF THE DRAWINGS

The embodiments will be described in detail with reference to the following drawings in which like reference numerals refer to like elements wherein.

DETAILED DESCRIPTION

Embodiments of the invention may provide a lighting device for preventing deterioration Hereinafter, preferred embodiments of the invention will be described in detail with reference to the accompanying drawings. A technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

Figure 1:
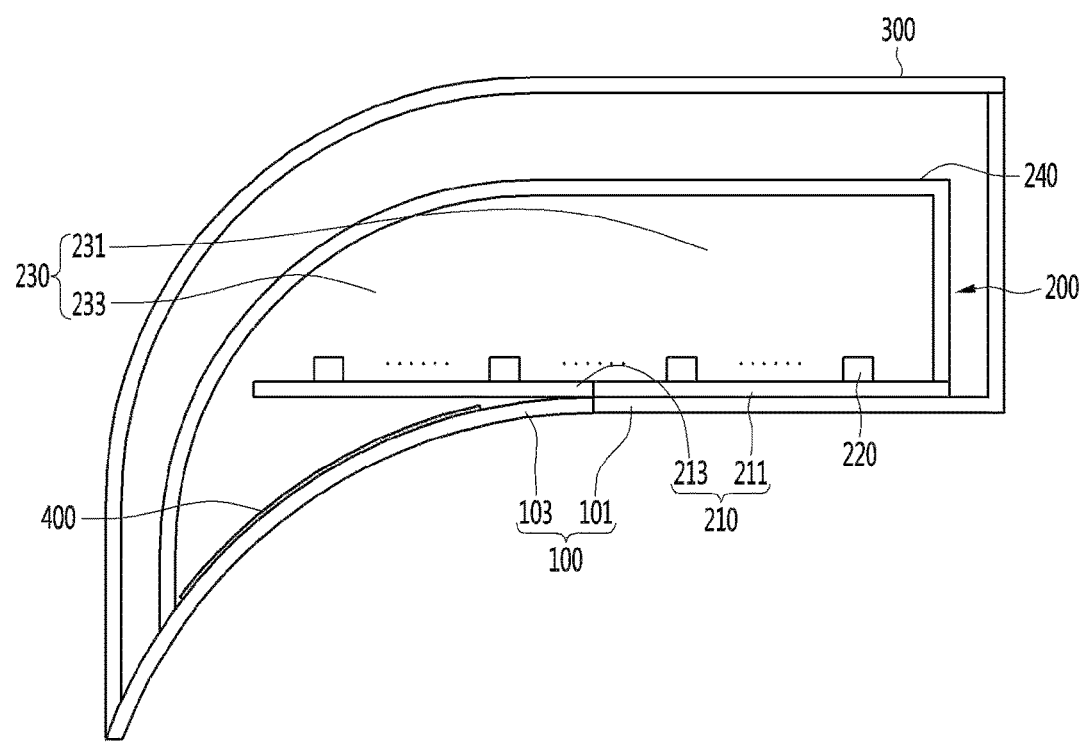
FIG. 1 is a schematic cross-sectional view showing a vehicle lamp according to a first embodiment of the invention.
Figure 2:
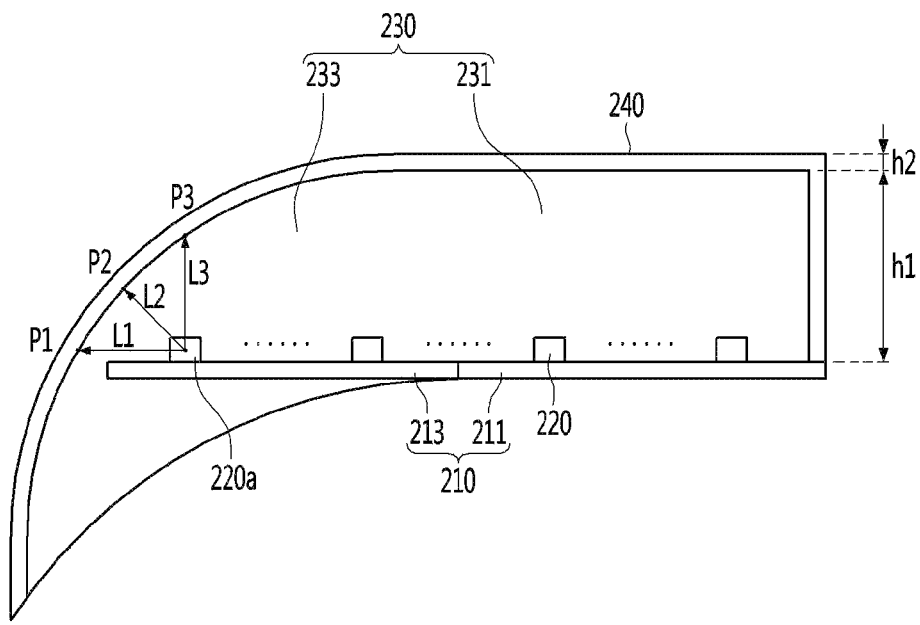
FIG. 2 is a schematic cross-sectional view showing the structure of a lighting module according to the first embodiment.
Figure 3:
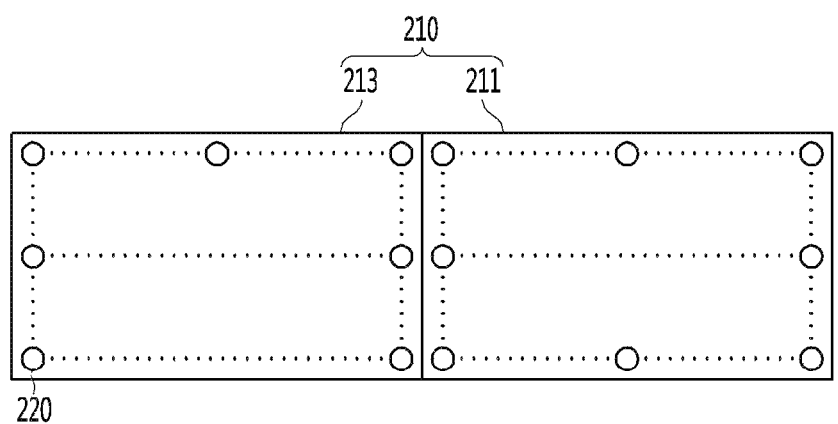
FIG. 3 is a plan view showing the substrate of FIG. 1.
Figure 4:
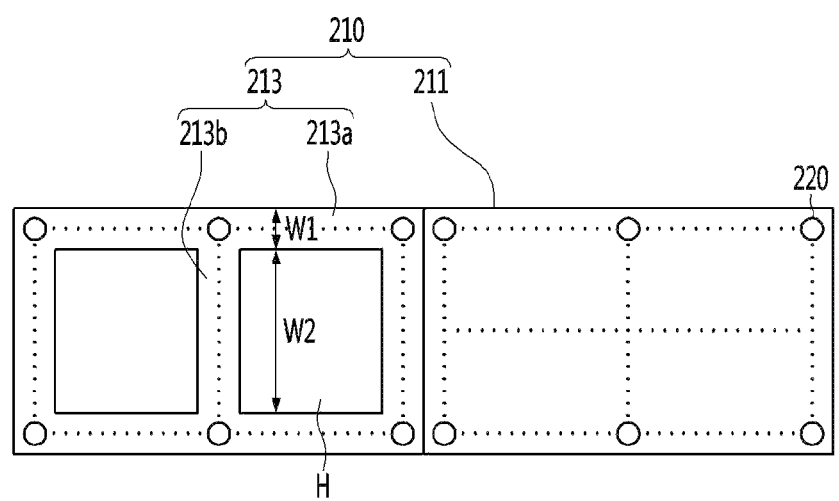
FIG. 4 is a plan view illustrating a modified example of the substrate of FIG.
Figure 5:
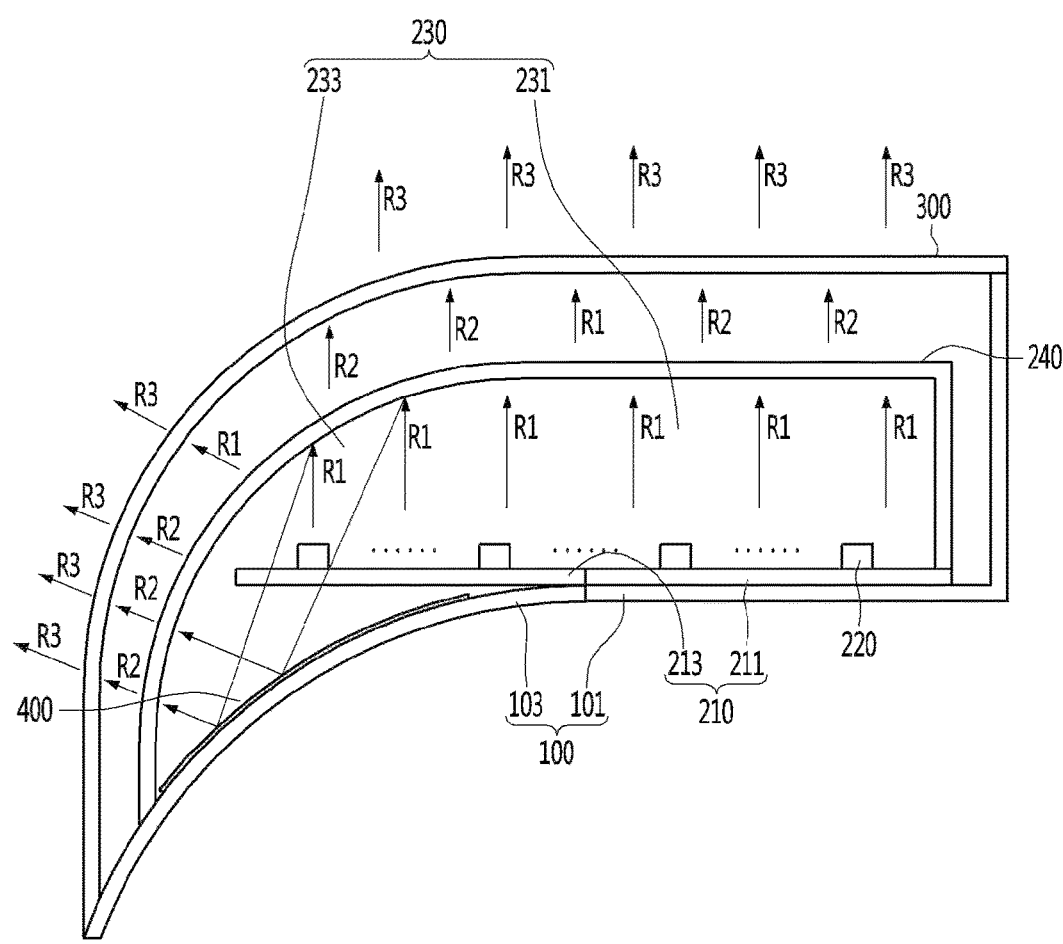
FIG. 5 is a view for explaining a light progress direction of the vehicle lamp according to the first embodiment.

FIG. 1 is a schematic cross-sectional view showing a vehicle lamp according to a first embodiment of the invention, FIG. 2 is a schematic cross-sectional view showing the structure of a light emitting module according to the first embodiment, FIG. 3 is a plan view showing the substrate of FIG. 1, FIG. 4 is a plan view illustrating a modified example of the substrate of FIG. 1, and FIG. 5 is a view for explaining a light progress direction of the vehicle lamp according to the first embodiment.

Referring to FIGS. 1 and 2, the vehicle lamp according to the first embodiment of the invention includes a base member 100, a lighting module 200 disposed on the base member 100, and a front lens 300 disposed on the lighting module 200. The lighting module 200 may be a device or module for a surface lighting or a surface emitting emission.

The base member 100 serves to support the lighting module 200 while maintaining the external shape of the rear lamp of the vehicle. The base member 100 may be coupled to a lamp bracket mounted on the rear direction of the vehicle. To this end, a coupling structure may be formed in the base member 100 to be coupled to a lamp of the vehicle or to support the lighting module. Such the coupling structure may include a coupling structure such as a screw or a hook, but is not limited thereto. The base member 100 may include a straight portion 101 and a curved portion 103. The straight portion 101 and the curved portion 103 may be integrally formed, but for convenience of description, each will be described as two components. The straight portion 101 may include a region overlapping at least one light source in a vertical direction. The curved portion 103 may include a region overlapping at least one light source in a vertical direction. The straight portion 101 may be formed toward the rear direction of the vehicle. The curved portion 103 may be formed toward the rear direction and the side-rear direction of the vehicle. The base member 100 may be formed to surround the rear direction and the side-rear direction of the vehicle. One side of the straight portion 101 may further include a side wall portion for supporting the front lens 300, and the other side of the straight portion 101 may be connected to the curved portion 103. That is, the curved portion 103 may be a region connected or extended from the straight portion 101.

The lighting module 200 may be disposed on the base member 100. The lighting module 200 may emit light toward the rear direction and the lateral direction of the vehicle. The lighting module 200 is assembled to fit the shape of the base member 100, and may emit light that satisfies the light distribution laws of the rear direction and the side-rear direction of the vehicle. The lighting module 200 according to an embodiment of the invention includes a substrate 210, a plurality of light sources 220 disposed on the substrate 210, a resin layer 230 disposed on the plurality of light sources 220, and a phosphor layer 240 disposed on the resin layer 230. The substrate 210 may include an insulating material or a conductive material. The substrate 210 may be formed of a rigid or flexible material. The substrate 210 may be formed of a plurality of substrates. The substrate 210 may include a first substrate 211 disposed on the straight portion 101 of the base member 100 and a second substrate 213 disposed on the curved portion 103 of the base member 100. When the light emitted from the light source 220 is incident on the second substrate 213, it may be emitted backward through the second substrate 213.

As shown in FIG. 3, the first substrate 211 may be formed of an opaque material. The first substrate 211 may be formed in a polygonal plate shape, but is not limited thereto. The second substrate 213 may be disposed on one side or an outside of the first substrate 211. The second substrate 213 may be electrically connected to the first substrate 211. The second substrate 213 may include a transparent material. The light generated from the light source 220 may be emitted toward upper portions of the first substrate 211 and the second substrate 213. At the same time, a portion of the light may be emitted toward the lower portion of the second substrate 213 through the second substrate 213. The widths of the first substrate 211 and the second substrate 213 may be the same or different from each other. In general, since the width of the rear direction of the vehicle on which the lamp is installed is formed to be greater than the width of the side and rear directions, the width of the first substrate 211 may be greater than the width of the second substrate 213. In the embodiment of the invention, since the first substrate 211 is formed of an opaque material and the second substrate 213 is formed of a transparent material, there is an effect of reducing the cost compared to forming all of the transparent material. This is because the cost of a substrate made of a transparent material is usually higher than that of a substrate made of an opaque material.

As shown in FIG. 4, the first substrate 211 may be formed of an opaque material. The first substrate 211 may be formed in a polygonal plate shape, but is not limited thereto. The second substrate 213 may be disposed on one side or the outside of the first substrate 211. The second substrate 213 may be electrically connected to the first substrate 211. The second substrate 212 may include an opaque material. The second substrate 213 may be formed in a grid structure including a plurality of holes H. The second substrate 213 may include a first substrate portion 213a and a second substrate portion 213b. The first substrate portion 213a may extend outward in a direction perpendicular to the side surface of the first substrate 211. The first substrate portion 213a may extend horizontally outward with respect to the first substrate 211. The first substrate portion 213a may include a plurality of substrate portions. The plurality of first substrate portions 213a may be disposed parallel to each other, but the invention is not limited thereto. The second substrate portion 213b may be disposed in a direction parallel to the side surface of the first substrate 213a. The second substrate portion 213b may be formed to have a structure connecting the plurality of first substrate portions 213a. Accordingly, a plurality of holes H may be formed in the second substrate 213. The hole H may be formed by the first substrate portion 213a and the second substrate portion 213b. The first substrate portion 213a and the second substrate portion 213b may be disposed around the hole H. Upper surfaces of the first and second substrate portions 213a and 213b may be disposed on the same plane as the upper surface of the first substrate 211. The hole H may have a polygonal shape, but may be changed according to the structure of the second substrate 213, that is, the shapes of the first and second substrate portions 213a and 213b. The width w1 of the first substrate portion 213a may be smaller than the width w2 of the hole H. When the width w1 of the first substrate portion 213a is remarkably large, most of the light emitted to the lower portion of the second substrate 213 is blocked, so it is effective to form the width w1 of the first substrate portion 213a to be as small as possible to increase the amount of light emitted to the lower portion of the second substrate 213. The width of the second substrate portion 213b may correspond to the width of the first substrate portion 213a. Although the structure of the second substrate 213 may be formed in various structures, it is quite effective to form the light source 220 in a grid structure in order to uniformly dispose the light source 220 and distribute the light uniformly.

Referring to FIGS. 1 and 2, the light source 220 may be disposed on the substrate 210. As for the light source 220, N light sources 220 may be disposed in a long axis (column) direction of the substrate 210, and M light sources 220 may be disposed in a short axis (row) direction of the substrate 210. The N light sources 220 disposed in the long axis direction of the substrate 210 may be formed to have the same or different separation distances from each other. Each of the N and M may be two or more light sources. Likewise, the M light sources 220 disposed in the short axis direction of the substrate 210 may be formed to have the same or different separation distances from each other. The separation distance between the light sources 220 may be appropriately designed to effectively implement a surface light source. The light source 220 may include a light emitting device. The light source 220 may emit blue, green, red, white, infrared or ultraviolet light. The light source 220 according to the embodiment of the invention may emit blue light in the range of 420 nm to 470 nm with the best light efficiency. The light source 220 may be an LED chip or a device in which an LED chip is packaged. The light source 220 may be provided as a compound semiconductor. The light source 220 may be provided as, for example, a Group II-VI or Group III-V compound semiconductor. For example, the light source 220 may include at least two or more elements selected from aluminum (Al), gallium (Ga), indium (In), phosphorus (P), arsenic (As), and nitrogen (N). The light source 220 may include a first conductivity type semiconductor layer, an active layer, and a second conductivity type semiconductor layer. The first and second conductivity type semiconductor layers may be implemented with at least one of a Group III-V or Group II-VI compound semiconductor. The first and second conductivity type semiconductor layers may be formed of, for example, a semiconductor material having a composition formula of $In_xAl_yGa_{1-x-y}N$ ($0 \leq x \leq 1$, $0 \leq y \leq 1$, $0 \leq x+y \leq 1$). For example, the first and second conductivity type semiconductor layers may include at least one selected from the group consisting of GaN, AlN, AlGaN, InGaN, InN, InAlGaN, AlInN, AlGaAs, GaP, GaAs, GaAsP, AlGaInP, and the like. The first conductivity type semiconductor layer may be an n-type semiconductor layer doped with an n-type dopant such as Si, Ge, Sn, Se, or Te. The second conductivity type semiconductor layer may be a p-type semiconductor layer doped with a p-type dopant such as Mg, Zn, Ca, Sr, or Ba. The active layer may be implemented with a compound semiconductor. The active layer may be embodied as, for example, at least one of a Group III-V or Group II-VI compound semiconductor. When the active layer is implemented as a multi-well structure, the active layer may include a plurality of well layers and a plurality of barrier layers that are alternately disposed, and may be disposed in a semiconductor material having a composition formula of $In_xAl_yGa_{1-x-y}N$, ($0 \leq x \leq 1$, $0 \leq y \leq 1$, $0 \leq x+y \leq 1$). For example, the active layer may include at least one selected from the group consisting of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs.

The resin layer 230 serves to guide the light emitted from the light source 220. The resin layer 230 may be made of a transparent resin material, for example, a resin material such as UV (ultraviolet) resin, silicone, or epoxy. The resin layer 230 may further include a diffusion agent (beads or dispersing agent, not shown) therein. The diffusion agent may have a spherical shape, and the size thereof may be in the range of 4 μm to 6 μm. The shape and size of the diffusion agent are not limited thereto. The resin layer 230 may include a first resin portion 231 and a second resin portion 233. The first resin portion 231 may be disposed on the substrate 210 and the light source 220. The first resin portion 231 may be disposed on the upper surface of the first substrate portion 211, and may cover upper surfaces and side surfaces of the light sources 220 disposed on the first substrate portion 211. An upper surface of the first resin portion 231 may be parallel to an upper surface of the substrate 210. One side of the first resin portion 231 may be disposed in a vertical direction with respect to the upper surface of the first resin portion 231. The second resin portion 233 may cover the second substrate 213. The second resin portion 233 may cover upper surfaces and side surfaces of the light sources 220 disposed on the second substrate 213. The second substrate 213 may be accommodated in the second resin portion 233. The second resin portion 233 may cover upper portions of the second substrate 213 and the light source 220. The second resin portion 233 may cover a lower portion of the second substrate 213. The second resin portion 233 may cover an upper region and a lower region of the second substrate 213. The outer side of the second resin portion 233 may extend outward more than the outer end of the second substrate 213. The upper surface or surface of the second resin portion 233 may include a curved surface. The upper surface of the second resin portion 233 may extend outwardly from one side of the first resin portion 231 in a curved or inclined surface. The distance from the upper surface or surface of the second resin portion 233 to the light source 220 may gradually decrease toward the edge or the outer end of the upper surface or surface of the second resin portion 233. The curved surface of the second resin portion 233 may extend from the upper surface of the first resin portion 231 or the horizontal upper surface of the second resin portion 233 to the upper surface of the curved portion 103. The curved surface of the second resin portion 233 may be a curved surface or a convex side surface convex outward from the light source 220 disposed on the upper surface of the second substrate 213.

A lower surface of the second resin portion 233 may be formed along an upper surface of the base member 103. The lower surface of the second resin portion 233 may include a curved surface. The lower surface of the second resin portion 233 may be formed along the curved portion 103 or may be in contact with the curved portion 103. The distance between the lower surface of the second resin portion 233 and the light source 220 may gradually increase toward the lower edge of the second resin portion 233. A width or a gap between the upper surface of the second resin portion 233 and the lower surface of the second resin portion 233 may decrease toward an outer edge of the second resin portion 233. The second resin portion 233 may guide the light emitted from the upper surface of the light source 220. In addition, the second resin portion 233 may guide the light emitted through the lower surface of the light source 220 or the second substrate 213.

The phosphor layer 240 may be formed on the resin layer 230. The phosphor layer 240 may be formed to cover the upper and side surfaces of the resin layer 230. The phosphor layer 240 may be disposed between the resin layer 230 and the front lens 300. The phosphor layer 240 may include a transparent material. The phosphor layer 240 may include a transparent insulating material. The phosphor layer 240 may be made of a silicon material, or may be made of a silicon material having different chemical bonds. Silicone is a polymer in which inorganic silicon and organic carbon are combined, and has physical properties such as thermal stability, chemical stability, abrasion resistance, and glossiness of inorganic substances and reactivity, solubility, elasticity, and processability, which are characteristics of organic substances. The silicon may include general silicon and fluorine silicon with an increased fluorine ratio. Increasing the fluorine ratio of fluorinated silicon has an effect of improving moisture resistance. The phosphor layer 240 may include a wavelength conversion means that receives the light emitted from the light source 220 and provides wavelength-converted light. For example, the phosphor layer 240 may include at least one selected from the group consisting of phosphors and quantum dots. The phosphor or quantum dots may emit blue, green, or red light. The phosphor may be evenly disposed in the phosphor layer 240. The phosphor may include a phosphor of a fluoride compound, for example, may include at least one of an MGF-based phosphor, a KSF-based phosphor, or a KTF-based phosphor. When the phosphor is a red phosphor, the red phosphor may have a wavelength range of 610 nm to 650 nm, and the wavelength may have a width of less than 10 nm. The red phosphor may include a fluoride-based phosphor. The phosphor may include 2 wt % to 20 wt % based on the weight of the phosphor layer 240. Accordingly, the phosphor layer 240 may emit the blue light emitted from the light source 220 in the second color of 590 nm to 610 nm. The second color may be an orange color. The phosphor layer 240 requires 35% or more of phosphor in order to emit blue color as a complete red color, but in the embodiment of the invention, since the front lens of red color is provided, even if the content of the phosphor is reduced, the final color may be emitted as a red color.

As shown in FIG. 2, the height h1 of the resin layer 230 may be 5 mm or less, for example, 4 mm to 5 mm. When the height h1 of the resin layer 230 is formed to be less than 4 mm, surface uniformity may be reduced. When the height h1 of the resin layer 230 exceeds 5 mm, the size of the product may be increased. The height h2 of the phosphor layer 240 may be 1 mm or less, for example, 0.5 mm to 1 mm. When the height h2 of the phosphor layer 240 is less than 0.5 mm, light may not be effectively converted. When the height h2 of the phosphor layer 240 exceeds 1 mm, the size of the product may be increased. The distance between the light sources 220 may include 4 mm or more, for example, 4 mm to 7 mm. The distance between the light sources 220 may be greater than the height h1 of the resin layer 230. When the distance between the light sources 220 is less than 4 mm, a hot spot may be generated, and when the distance between the light sources 220 exceeds 7 mm, the surface uniformity is deteriorated.

The second resin portion 233 may include a first point P1, a second point P2, and a third point P3. The first point P1, the second point P2, and the third point P3 may be points on the curved surface of the second resin portion 233 where the second resin portion 233 and the phosphor layer 240 contact each other. The light source 220 may include a first light source 220a. The first light source 220a may be a light source disposed closest to the side surface of the second resin portion 233. The first point P1 may be a region in contact with the second resin portion 233 in a horizontal direction from the center of the first light source 220a to the substrate 210. The third point P3 may be a region in contact with a straight line perpendicular to the substrate 210 from the center of the first light source 220a and the second resin portion 233. The second point P2 may be any one region of the second resin portion 233 between the first point P1 and the third point P3. The third distance L3 from the center of the first light source 220a to the third point P3 may be greater than the first distance L1 between the center of the first light source 220a and the first point P1, and the second distance L2 between from the center of the first light source 220a to the second point P2. The second distance L2 from the center of the first light source 220a to the second point P2 may be greater than the first distance L1 from the center of the first light source 220a to the first point P1. Conventionally, since the distance between the center of the light source and the first, second, and third points was not optimized, dark lines were generated at the second point. In the embodiment of the invention, by forming the curved surface of the second resin portion 233 to reduce the second distance L2 between the second point P2 from the center of the first light source 220a, there is an effect of improving the light efficiency on the second point P2.

The lighting module 200 according to the embodiment of the invention has the effect of emitting the light emitted to the rear direction of the vehicle and the light emitted to the side-rear direction of the vehicle to comply with the light distribution law. As shown in FIG. 1, a reflective member 400 may be further disposed on the curved portion 103 of the base member 100. The reflective member 400 may reflect the light emitted to the lower portion of the second substrate 213 to emit the light toward the side-rear direction of the vehicle. That is, the reflective member 400 has an effect of further improving the light efficiency in the side-rear direction of the vehicle. The reflective member 400 may include a white material. The reflective member 400 may include a resin material. The reflective member 400 may include silicon, epoxy, or the like. The reflective member 400 may include a reflective material, for example, $TiO_2$. The reflective member 400 may be provided in the form of a film. Alternatively, the reflective member 400 may be formed by depositing on the curved portion 103 of the base member 100. The curved portion 103 and the outer end of the reflective member 400 may be maximally spaced apart from the lower surface of the second substrate 213.

The front lens 300 may serve to irradiate the light irradiated from the light source 220 by concentrating it in all directions or dispersing it in the opposite direction. The front lens 300 may be a transmissive plate that covers the upper and outer regions of the lighting module 200. The front lens 300 may be a lens of a red color. The front lens 300 is formed in a red color, so that the light emitted from the lighting module 200 may emit a red color having a wavelength of 620 nm to 630 nm. One side and the other side of the front lens 300 may be coupled to the base member 100. The front lens 300 may be formed to correspond to the shape of the rear lamp of the vehicle. The front lens 300 may include an inner lens or an outer lens. The front lens 300 may be formed in plurality.

Hereinafter, an optical path will be described in detail with reference to FIG. 5. Referring to FIG. 5, the light source 220 disposed on the substrate 210 may emit the first light R1 of a first color in a wavelength range of 420 nm to 470 nm. Here, the first color may be blue light. The first light R1 may be incident on the resin layer 230. The first light R1 may be converted from a point light source to a surface light source by the resin layer 230. The first light R1 may be reflected to a lower portion of the second substrate 213 as the second substrate 213 is formed of a transparent material or a grid structure. The first light R1 reflected downward of the second substrate 213 may be reflected by the reflective member 400 to be incident on the side surface of the second resin portion 233. The first light R1 may be incident on the phosphor layer 240. The phosphor layer 240 may convert the first light R1 into the second light R2 by a wavelength conversion means, for example, a phosphor. Here, since the concentration of the phosphor contained in the phosphor layer 240 is small, the phosphor layer 240 may emit a portion of the first light R1 that is not light-converted. Here, the first light R1 may be less than 3% of the total light. Accordingly, the phosphor layer 240 may emit light of the second color in a wavelength range of 590 nm to 610 nm. In addition, the phosphor layer 240 may serve as a diffusion plate in the process of converting the first light R1 into the second light R2. The first light R1 and the second light R2 emitted from the phosphor layer 240 may be incident on the front lens 300. At this time, since the front lens 300 is formed in a red color, the first light R1 is absorbed by the front lens 300 and disappears. Due to this, the first light R1 is removed from the front lens 300 and only the second light R2 is present, so the third light R3 of the third color in a wavelength range of 620 nm to 630 nm may be be emitted from the exit surface of the front lens 300.

The lighting device according to the embodiment of the invention may emit light conforming to the light distribution law from the rear direction by horizontally arranging the substrate 210. At the same time, by forming the second substrate 213 in a transparent material or a grid structure, the efficiency of light emitted from the side-rear direction of the vehicle may be increased.

Figure 6:
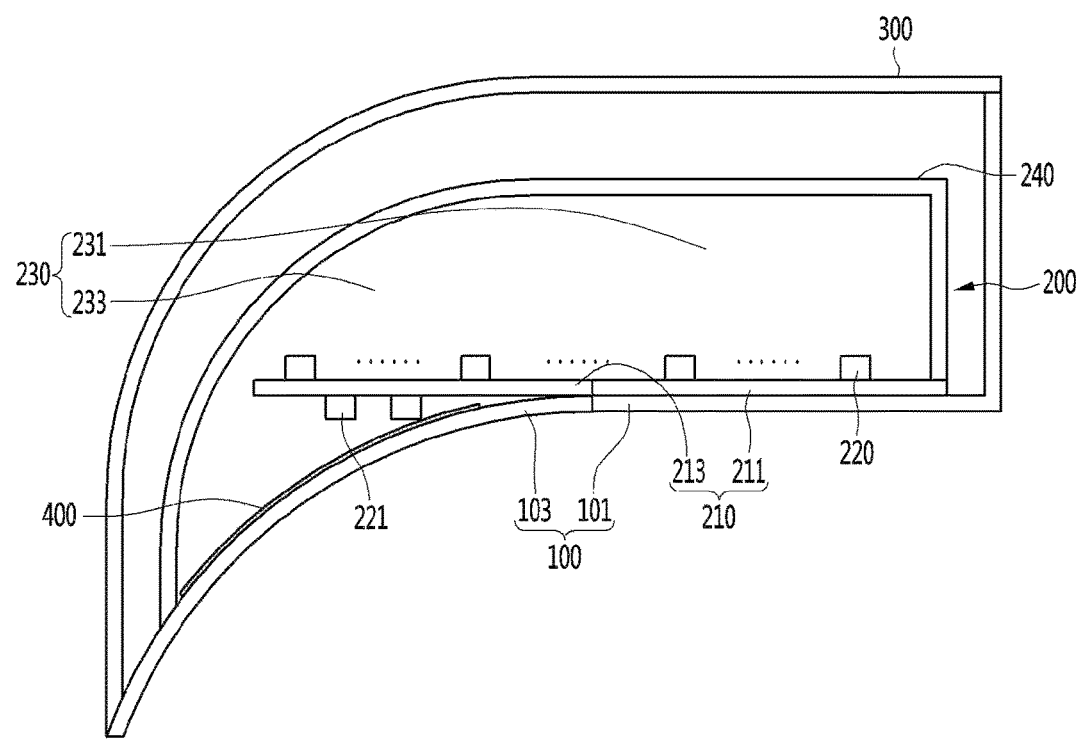
FIG. 6 is a schematic cross-sectional view showing a vehicle lamp according to a second embodiment of the invention.
Figure 7:
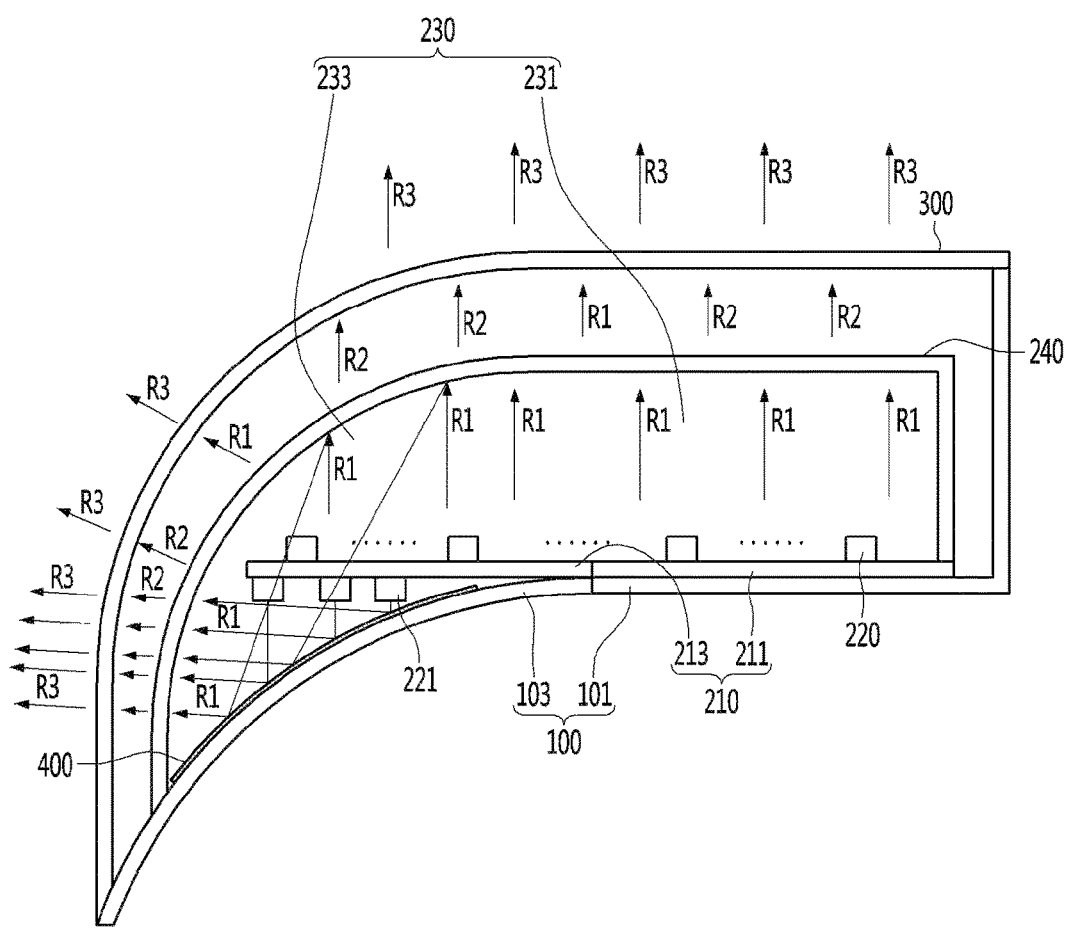
FIG. 7 is a view for explaining a light progress direction of a vehicle lamp according to the second embodiment.

FIG. 6 is a schematic cross-sectional view illustrating a vehicle lamp according to a second embodiment of the invention, and FIG. 7 is a view for explaining a light propagation direction of the vehicle lamp according to the second embodiment.

Referring to FIG. 6, the vehicle lamp according to the second embodiment of the invention includes a base member 100, a lighting device disposed on the base member 100, for example, a lighting module 200, a front lens 300 disposed on the lighting module 200, and a reflective member 400 disposed on the base member. Here, the configuration except for the lighting module 200 is the same as the configuration of the vehicle lamp according to the first embodiment, and thus will be briefly described. The base member 100 may include a straight portion 101 and a curved portion 103. The straight portion 101 may be formed toward the rear direction of the vehicle. The curved portion 103 may be formed toward the rear direction and the side-rear direction of the vehicle. One side of the straight portion 101 may further include a side wall portion for supporting the front lens 300. The lighting module 200 may be disposed on the base member 100. The lighting module 200 may emit light toward the rear direction and side direction of the vehicle. The lighting module 200 is assembled to fit the shape of the base member 100, and may emit light that satisfies the light distribution laws of the rear direction and side-rear direction of the vehicle. The reflective member 400 may be disposed on the curved portion 103 of the base member 100. The reflective member 400 may reflect the light emitted to the lower portion of the second substrate 213 to emit the light toward the side-rear direction of the vehicle. The front lens 300 may serve to irradiate the light irradiated from the light source 220 by concentrating and irradiating it in a forward direction or by dispersing it in the opposite direction. The front lens 300 may be a lens of a red color. The front lens 300 may include an inner lens or an outer lens.

On the other hand, the lighting module according to the second embodiment may include a substrate 210, a plurality of light sources 220 disposed on the substrate 210, a resin layer 230 disposed on the light source 220, and a phosphor layer 240 disposed on the resin layer 230. The substrate 210 may include the first substrate 211 disposed on the straight portion 101 of the base member 100 and the second substrate 213 disposed on the curved portion 103 of the base member 100. The second substrate 213 may be configured to emit light emitted from the light source 220 to the lower portion of the second substrate 213. The first substrate and the second substrate may be formed in the same structure as in FIGS. 3 and 4, the above description may be referred to, and may be selectively applied to the second embodiment.

The light source 220 may be disposed on the substrate 210. The light source 220 may include a light emitting device. The light source 220 may emit blue light in the range of 420 nm to 470 nm having the best light efficiency. The light source 200 may include a plurality of light sources 220 disposed on the first substrate 211 and the second substrate 213. The light source 220 may include a second light source 221 disposed under the second substrate 213. The second light source 221 may include a plurality of light sources. The second light source 221 may emit light to the lower portion of the second substrate 213. The light emitted to the lower portion of the second substrate 213 may be reflected by the reflective member 400 and emitted to the side surface of the second resin portion 233. The resin layer 230 may include a first resin portion 231 and a second resin portion 233. The first resin portion 231 may be disposed on the substrate 210 and the light source 220. The first resin portion 231 may be formed to cover upper surfaces and side surfaces of the plurality of light sources 220. The second resin portion 233 may accommodate the second substrate 213, the plurality of light sources 220 and the second light sources 221 therein. The second resin portion 233 may be disposed to cover upper portions of the second substrate 213 and the light source 220, and to cover lower portions of the second substrate 213 and the second light source 221. The phosphor layer 240 may be formed on the resin layer 230. The phosphor layer 240 may be formed to cover the upper and side surfaces of the resin layer 230. The phosphor layer 240 may be disposed between the resin layer 230 and the front lens 300. The phosphor layer 240 may include a phosphor therein. The phosphor may include 2 wt % to 20 wt % based on the weight of the phosphor layer 240. These configurations may selectively apply the configuration of the first embodiment.

As shown in FIG. 7, the light emitted by the light source disposed on the substrate may be the same as the flow of light in FIG. 5. As shown in FIG. 7, the light emitted from the second light source 221 may include the first light R1. The first light R1 is incident on the second resin portion 233 and travels toward the reflective member 400. The first light R1 reaching the reflective member 400 is reflected by the reflective member 400 and is emitted to the side surface of the second resin portion 233. In this case, a portion of the first light R1 may be reflected toward the upper portion of the second substrate 213. The first light R1 laterally reflected by the second resin portion 233 may be converted into the second light R2 by the phosphor layer 240. A portion of the first light R1 may pass through the phosphor layer 240. Since the content of the phosphor 240 is about 2 wt % to 20 wt %, a portion of the first light R1 may not be converted. The first light R1 passing through the phosphor layer 240 may be absorbed by the red front lens 300, and the front lens 300 may emit the third light R3 of the third color. These configurations can selectively apply the configuration of the first embodiment. According to the embodiment of the invention, by further providing a plurality of second light sources 221 on the rear surface of the second substrate 213, there is an effect that the light efficiency of the rear direction and side of the vehicle can be further improved.

ration of durability of a light source module and a vehicle lamp including the same.

An embodiment of the invention may provide a lighting device for satisfying a rear direction and a side-rear direction of light distribution regulations of a vehicle and a vehicle lamp including the same.

A lighting device according to an embodiment of the invention includes: a base member including a straight portion and a curved portion bent at one end of the straight portion, the curved portion having a curvature; a substrate including a first substrate disposed on a straight portion of the base member and a second substrate disposed parallel to the first substrate and spaced apart from the curved portion of the base member; a plurality of light sources disposed on the substrate; a resin layer including a first resin portion disposed on the first substrate and a second resin portion disposed on the curved portion of the base member to surround the second substrate; and a phosphor layer disposed on the resin layer, wherein the second resin portion includes one side contacting the first resin portion and the other side facing the one side surface, and a side surface of the second resin portion may include a curved surface.

A lighting device according to an embodiment of the invention includes: a substrate including a first substrate and a second substrate disposed outside the first substrate; a plurality of light sources disposed on each of the first substrate and the second substrate; a resin layer including a first resin portion disposed on the first substrate and a second resin portion disposed on an upper portion, an outer side, and a lower portion of the second substrate; and a phosphor layer disposed on the resin layer, wherein a upper surface of the first resin portion is parallel to the first substrate, and a surface of the second resin portion has a curved surface with respect to the upper surface of the first substrate and extends outward from the outer side surface of the second resin portion has a curved surface, and the surface of the second resin portion may include a curved surface.

The plurality of light sources includes a first light source closest to a side surface of the second resin portion, and the second resin portion includes a first point in contact with the phosphor layer in a horizontal direction of the substrate from a center of the first light source; a third point in contact with the phosphor layer and a straight line perpendicular to the substrate from the center of the first light source, and a second point in contact with the phosphor layer between the first point and the third point, the first point in contact with the second resin, the second point on the curved surface, and the third point in contact with the straight line perpendicular to the substrate at the center of the first light source, and wherein a second distance may be greater than a distance from the center of the first light source to the second point and may be smaller than a third distance from the center of the first light source to the third point.

The second substrate may be formed of a transparent material and may be electrically connected to the first substrate. In addition, the second substrate may include a grid structure including a plurality of holes and may be electrically connected to the first substrate. The second substrate may include a first substrate portion in a direction perpendicular to a side surface of the first substrate portion and a second substrate portion parallel to the side surface of the first substrate. A width of the first substrate portion may correspond to a width of the second substrate portion, and the width of the first substrate portion may be smaller than a width of the hole. The plurality of light sources may include a second light source disposed under the second substrate.

A vehicle lamp according to an embodiment of the invention includes a base member coupled to a lamp bracket of a vehicle, and including a straight portion and a curved portion bent at one end of the straight portion and having a curvature, and a lighting module disposed on the base member; a lens of a red color disposed on the lighting module, wherein the lighting module includes a first substrate disposed on the straight portion of the base member, a second substrate disposed parallel to the first substrate and spaced apart from the curved portion of the base member, a plurality of light sources disposed on the first substrate and the second substrate, a first resin portion disposed on the first substrate and the light source, a second resin portion disposed on the curved portion of the base member so as to surround the second substrate and the light source, and a phosphor layer disposed on the first resin portion and the second resin portion, wherein the second resin portion includes one side contacting the first resin portion and the other side surface disposed to face the one side surface, and the side surface of the second resin portion may include a curved surface.

The embodiment of the invention has the effect of preventing the durability of the lighting module from being deteriorated as the substrate is horizontally arranged. By arranging the substrate horizontally, it is possible to emit light conforming to the light distribution law from the rear direction. By forming the second substrate in a transparent material or a grid structure, there is an effect of increasing the efficiency of light emitted from the side-rear direction. By additionally disposing a light source on the rear surface of the substrate, there is an effect of further increasing the efficiency of the light emitted through the side-rear direction. By using a low-concentration phosphor layer, there is an effect of reducing costs.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting device comprising:
   a substrate;
   a plurality of light sources disposed on an upper surface of the substrate;
   a resin layer disposed on the upper surface of the substrate; and
   a phosphor layer disposed on the resin layer;
   wherein the resin layer includes a first resin portion having a constant first thickness on the upper surface of the substrate, a second resin portion having a variable second thickness on the upper surface of the substrate, and a third resin portion contact second resin portion and extending to a lower surface of the substrate, and wherein the plurality of light sources is disposed in the first resin portion and the second resin portion of the resin layer.

2. The lighting device of claim 1, wherein an upper surface of the second resin portion has a curved surface.

3. The lighting device of claim 1, wherein a distance in a vertical direction between an upper surface of the second resin portion and the substrate has a distance shorter than a distance in the vertical direction between an upper surface of the first resin portion and the substrate.

4. The lighting device of claim 1, wherein an upper surface of the first resin portion has a flat surface.

5. The lighting device of claim 1, wherein the phosphor layer has a curved portion on the second resin portion.

6. The lighting device of claim 1, wherein the substrate has a first region under the first resin portion and a second region under the second resin portion, and wherein the first region and the second region of the substrate are horizontal.

7. The lighting device of claim 6, wherein a vertical distance between a light source and the phosphor layer on the second region has a distance greater than a vertical distance between a light source and the phosphor layer on the first region.

8. The lighting device of claim 1, wherein the third resin portion is connected to the second resin portion and is spaced apart from the first resin portion.

9. The lighting device of claim 8, wherein a portion connected between the second resin portion and the third resin portion is disposed outside a side surface of the substrate.

10. The lighting device of claim 8, wherein the phosphor layer extends to a surface of the third resin portion.

11. A vehicle lamp comprising:
a lighting module; and
a lens of a red color disposed on the lighting module,
wherein the lighting module is the lighting device of claim 1.

12. The lighting device of claim 1, further comprising a reflective member that faces the lower surface of the substrate, wherein the third resin portion extends between the reflective member and the lower surface of the substrate.

13. A lighting device comprising:
a base member including a straight portion and a curved portion extending from the straight portion;
a substrate on the base member;
a plurality of light sources disposed on an upper surface of the substrate;
a resin layer disposed on the upper surface of the substrate; and
a phosphor layer disposed on the resin layer,
wherein the resin layer includes a first resin portion having a first thickness and positioned over the straight portion of the base member, and a second resin portion having a curved surface and positioned over the curved portion of the base member,
wherein the phosphor layer extends to the curved surface of the second resin portion,
wherein a thickness of the phosphor layer is smaller than a thickness of the first resin portion, and
wherein the plurality of light sources is disposed in the first resin portion and the second resin portion of the resin layer.

14. The lighting device of claim 13, wherein the phosphor layer extends outside a side surface of the substrate.

15. The lighting device of claim 14, wherein the resin layer includes a portion disposed between the phosphor layer and the side surface of the substrate.

16. The lighting device of claim 13, wherein the phosphor layer extends outside a lower surface of the substrate.

17. The lighting device of claim 16, wherein the resin layer has a third resin portion extending to one side of the lower surface of the substrate.

18. The lighting device of claim 17, wherein the third resin portion is connected to the second resin portion and is spaced apart from the first resin portion.

19. The lighting device of claim 18, wherein the phosphor layer is disposed on the third resin portion and connected to the base member.

20. The lighting device of claim 18, wherein the third resin portion is disposed between the one side of the lower surface of the substrate and the curved portion of the base member.

* * * * *